United States Patent [19]

Fujioka

[11] Patent Number: 5,134,436

[45] Date of Patent: Jul. 28, 1992

[54] EXPOSURE CONTROL METHOD FOR ADJUSTING THE TEMPERATURE OF A WORKPIECE HOLDING CHUCK ATTRACTING SURFACE BASED ON MEMORIZED DATA

[75] Inventor: Hidehiko Fujioka, Atsugi, Japan

[73] Assignee: Canon Kabushiki Kaisha, Tokyo, Japan

[21] Appl. No.: 648,312

[22] Filed: Jan. 29, 1991

Related U.S. Application Data

[63] Continuation of Ser. No. 281,216, Dec. 8, 1988, abandoned.

[30] Foreign Application Priority Data

Dec. 10, 1987 [JP] Japan ................................ 62-310826

[51] Int. Cl.$^5$ .............................................. G03B 27/52
[52] U.S. Cl. ........................................ 355/30; 355/53; 355/77
[58] Field of Search ........................ 355/30, 43, 53, 55, 355/132, 77; 250/548

[56] References Cited

U.S. PATENT DOCUMENTS 4,503,335  3/1985  Takahashi ............................ 355/30

FOREIGN PATENT DOCUMENTS 3213239  11/1982  Fed. Rep. of Germany .

OTHER PUBLICATIONS

Patent Abstracts of Japan, vol. 6, No. 234, Nov. 20, 1982, Kokai No. 57-136,325.
Patent Abstracts of Japan, vol. 8, No. 53, Mar. 9, 1984, Kokai No. 58-207,634.

*Primary Examiner*—L. T. Hix
*Assistant Examiner*—Khanh Dang
*Attorney, Agent, or Firm*—Fitzpatrick, Cella, Harper & Scinto

[57] ABSTRACT

Disclosed is a method of exposure control for use in a step-and-repeat type exposure apparatus that includes a radiation source for emitting a radiation beam and a workpiece holding chuck having an attracting surface. The method includes placing a first workpiece on the attracting surface of the holding chuck so that the workpiece is attracted to and held by the holding chuck, moving the holding chuck stepwise so that different portions of the workpiece are sequentially brought to an exposure station and exposing that portion of the first workpiece placed at the exposure position, detecting the temperature of the attracting surface of the holding chuck each time a portion of the first workpiece is exposed, memorizing data related to the detected temperature, removing the first workpiece from the holding chuck and placing a second workpiece on the attracting surface of the holding chuck, moving the holding chuck, bearing the second workpiece, stepwise for exposure of different portions of the second workpiece and adjusting the temperature of the attracting surface of the holding chuck each time a portion of the second workpiece is brought to the exposure position, in accordance with the memorized data.

2 Claims, 8 Drawing Sheets

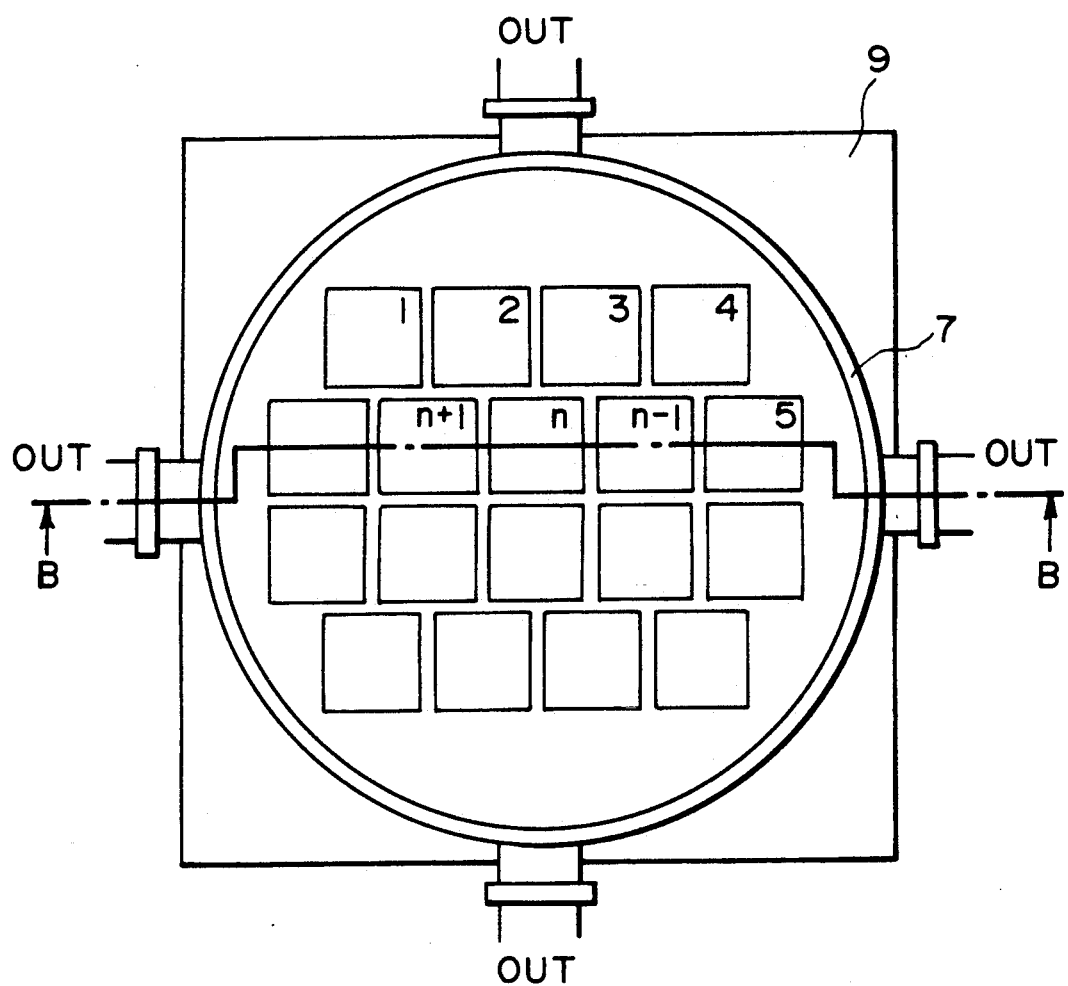
F I G. 2A

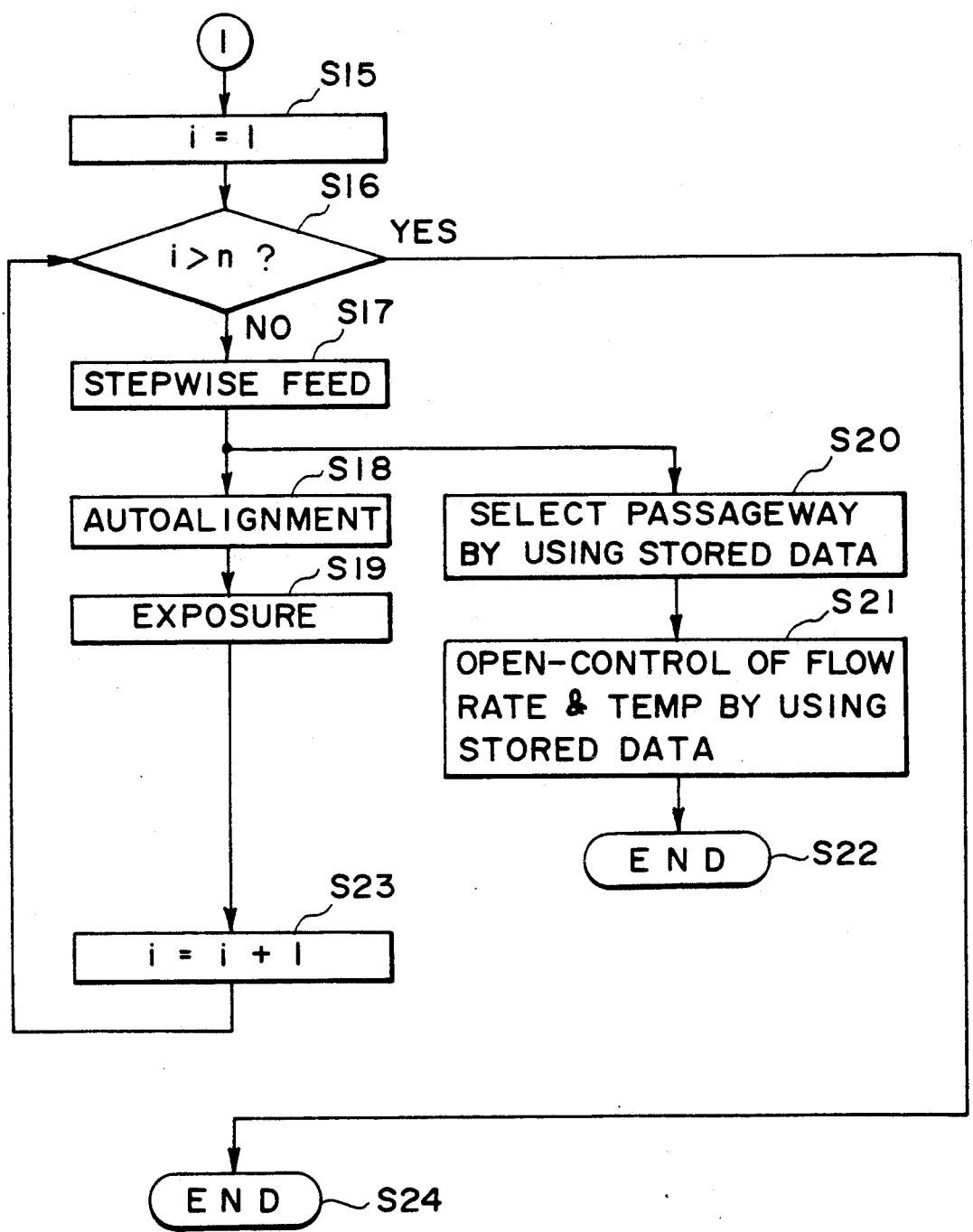
F I G. 3B

EXPOSURE CONTROL METHOD FOR ADJUSTING THE TEMPERATURE OF A WORKPIECE HOLDING CHUCK ATTRACTING SURFACE BASED ON MEMORIZED DATA

This application is a continuation of prior application Ser. No. 07/281,216 filed Dec. 8, 1988, now abandoned.

FIELD OF THE INVENTION AND RELATED ART

This invention relates to a holder for holding a workpiece or otherwise. More particularly, the invention is concerned with a holder or chucking device, particularly suitably usable in an exposure apparatus for use in the manufacture of semiconductor microcircuit devices for transferring a pattern of a mask or photomask onto a wafer, for holding the wafer by attraction, for example.

In the manufacture of semiconductor microcircuit devices, a semiconductor workpiece, called a wafer, is used. Since such a wafer is formed by a very thin material, it is very difficult to maintain the shape of the wafer constant during semiconductor microcircuit manufacturing processes. This is because the shape of a wafer can be easily deformed due to a temperature change, or otherwise, around the wafer. Also, it is very difficult to control the temperature during manufacturing processes to maintain the same exactly constant. In a circuit pattern printing process using an exposure apparatus, usually the printing is repeated to print different patterns on a wafer superimposingly. Any change in the shape of a wafer in the course of such a printing process causes deterioration of the pattern overlay accuracy, which might result in failure to produce a desired circuit pattern. Particularly, in recent submicron or half micron linewidth pattern printing, such a problem, namely, a pattern overlay error, cannot be disregarded.

While many proposals have been made in an attempt to solve the problem of wafer deformation, one representative method is to control the temperature of a wafer or mask, as a whole, to thereby prevent deformation of the wafer or mask due to a temperature change. An alternative method is to control the temperature so as to positively deform a wafer or mask into a desired shape.

SUMMARY OF THE INVENTION

On the other hand, step-and-repeat type exposure apparatuses (each called a "stepper") have been prevalently used, in the recent trend of further miniaturization of circuit patterns and enlargement of wafer diameters. In this type of exposure apparatuses, radiation energy is locally projected upon a wafer at certain time. The inventor of the subject application has found that such local irradiation of a wafer with radiation energy (such as a light) involves a possibility of creation of local distortion of the wafer. The possibility is significantly high, particularly when the intensity of the radiation energy is high. The local distortion of a wafer, if any, can easily cause an alignment error. Such an alignment error may be particularly notable, where the mask-to-wafer alignment operation should be made each time one shot area on the wafer is moved stepwise to an exposure station. As a matter of course, the alignment error results in a pattern overlay error.

In an attempt to solve the above-described problem, it may be considered to use a conventional temperature controlling method. For example, it may be considered to circulate a constant-temperature gas or liquid around a wafer so as to maintain a constant temperature throughout the wafer, as a whole. Depending on the manner of circulation, it may be possible to remove the energy concentrated locally upon a wafer. However, this method requires use of a large rate of flow of a temperature controlled gas or liquid, which inevitably results in an increased resistance of a passageway to the flowing temperature-controlled gas or liquid. This is undesirable, because such an increased resistance easily causes an increased vibration. If such a vibration occurs during the exposure, it causes inconveniences, such as uneven exposure, blurring or otherwise. If, on the other hand, the vibration occurs during the alignment operation, it causes an alignment error or prolongation of the time required for completing the alignment. Thus, the problem of such vibration cannot be disregarded, particularly in the field of fine pattern printing as described hereinbefore.

It is an object of the present invention to provide a temperature controlling system suitably usable in a step-and-repeat type exposure apparatus, which system is effective to prevent occurrence of distortion of a workpiece, such as a wafer, due to local concentration of energy as described hereinbefore and also which is effective to alleviate the effect of vibration during the exposure.

In accordance with one preferred form of the present invention, to achieve this object, there is provided a temperature controlling system by which temperature control can be made locally and concentratingly to each portion of a wafer when it is at an exposure position and, if desired, to a portion adjacent that portion.

It is another object of the present invention to provide a step-and-repeat type exposure apparatus having an arrangement which, on one hand, is effective to execute the temperature control such as described above and which, on the other hand, is effective to assure a high throughput efficiency.

In accordance with one preferred form of the present invention, to achieve this object, the variation in temperature of each portion of a wafer at an exposure position and, if desired, a portion adjacent to that portion, caused as a result of exposure (irradiation with radiation energy), is measured in advance and those data concerning the detected variations are also stored in advance. By using the stored data, at actual exposures (pattern printing operations), the temperature control is made in an appropriate manner.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2A is a plan view of a wafer chucking table with a temperature adjusting function, usable in the embodiment of FIG. 1.

FIGS. 3A and 3B show, in combination, the flow of sequential operations made in the embodiment of FIG. 1.

DESCRIPTION OF THE PREFERRED EMBODIMENTS

Figure 1:
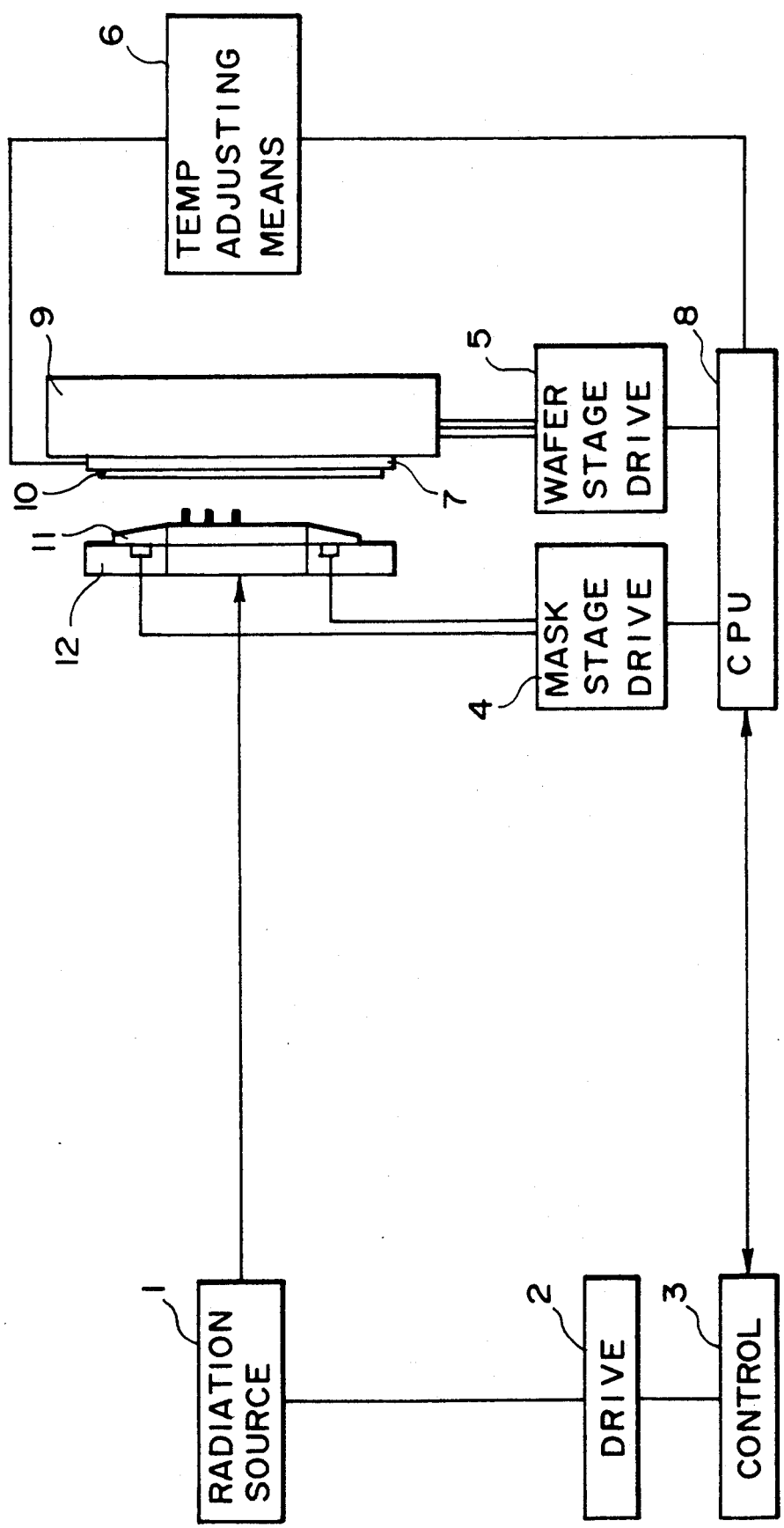
FIG. 1 is a schematic and diagrammatic view of a step-and-repeat type exposure apparatus according to one embodiment of the present invention.

Referring first to FIG. 1, showing the general arrangement of a step-and-repeat type exposure apparatus according to a first embodiment of the present invention, the apparatus includes a radiation energy source 1 which may be an X-ray source, an ultraviolet ray source or otherwise; a radiation source driver 2 for actuating the radiation energy source; a controller 3 for controlling the driver 2; a mask stage 12 for holding thereon a mask 11; a mask stage drive 4 for controllably moving the mask stage 12; a wafer stage 9 for movably supporting a wafer 10; a wafer stage drive 5 for controllably moving the wafer stage 9; a wafer chucking table 7 having a temperature adjusting function, for holding a wafer 10 by attraction, the table 7 being supported by the wafer stage 9; a temperature adjusting means 6 cooperable with the chucking table 7 to execute the temperature control of a wafer 10 held by the chucking table; and a central processing unit (CPU) 8 which is electrically coupled to each of the mask stage drive 4, the wafer stage drive 5, the temperature adjusting means 6 and the controller 3, for executing various controls to be made in the exposure apparatus, as a whole.

A mask 11 placed on the mask stage 12 has a pattern which is transferred, when the mask is irradiated with radiation energy supplied from the radiation source 1, onto different shot areas on a wafer 10, in a predetermined order, with the cooperation of the wafer stage 9. In this step-and-repeat pattern transfer process, temperature control (controlled cooling) is concentratingly made to each portion of the wafer 10 when it is at the exposure position, by using the attracting table 7 having a temperature adjusting function. Details of this will now be explained with reference to FIGS. 2A–2C.

Figure 2B:
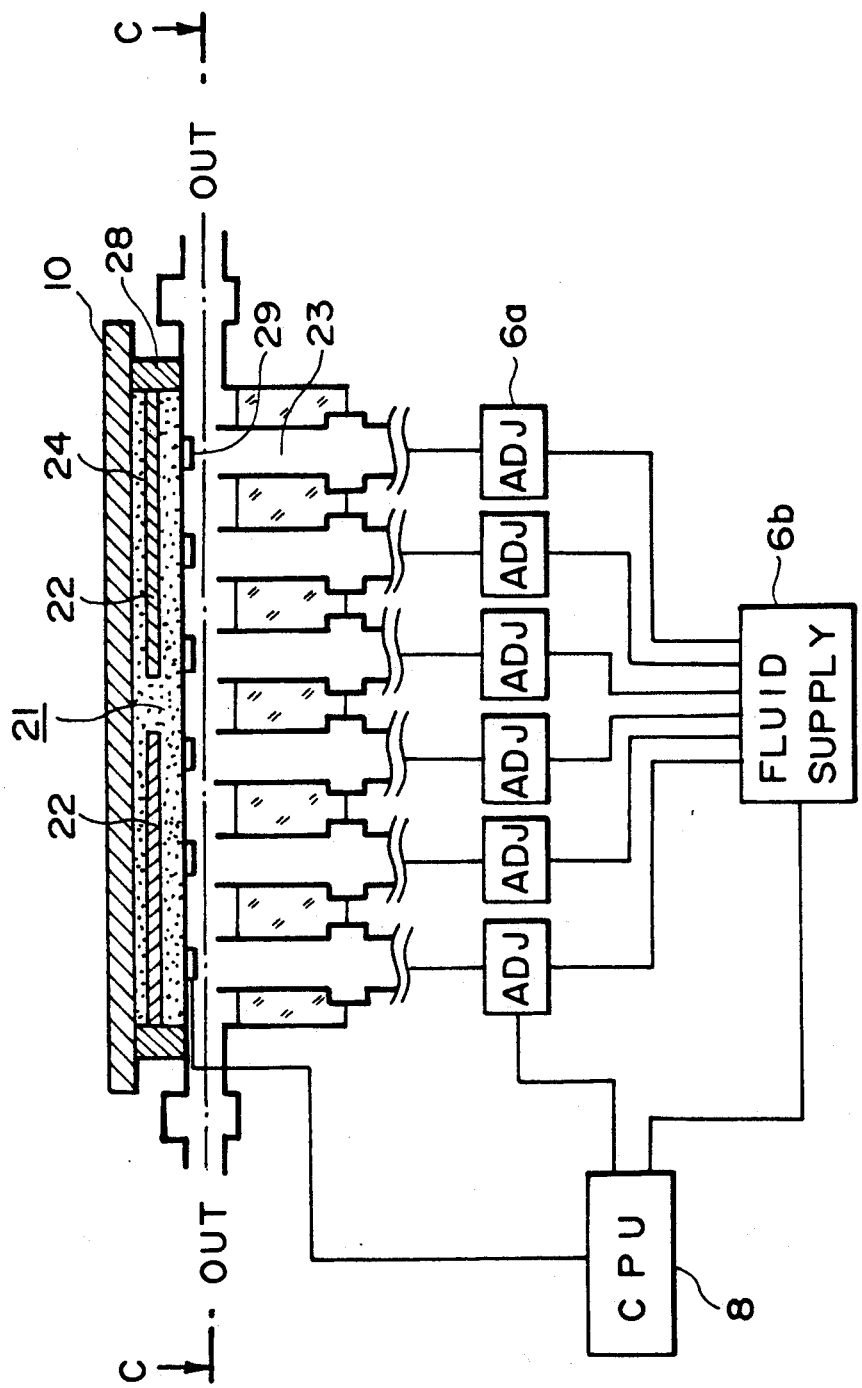
FIG. 2B is a representation, partly sectional taken on a line B—B in FIG. 2A and partly diagrammatic, showing details of the wafer chucking table of FIG. 2A.
Figure 2C:
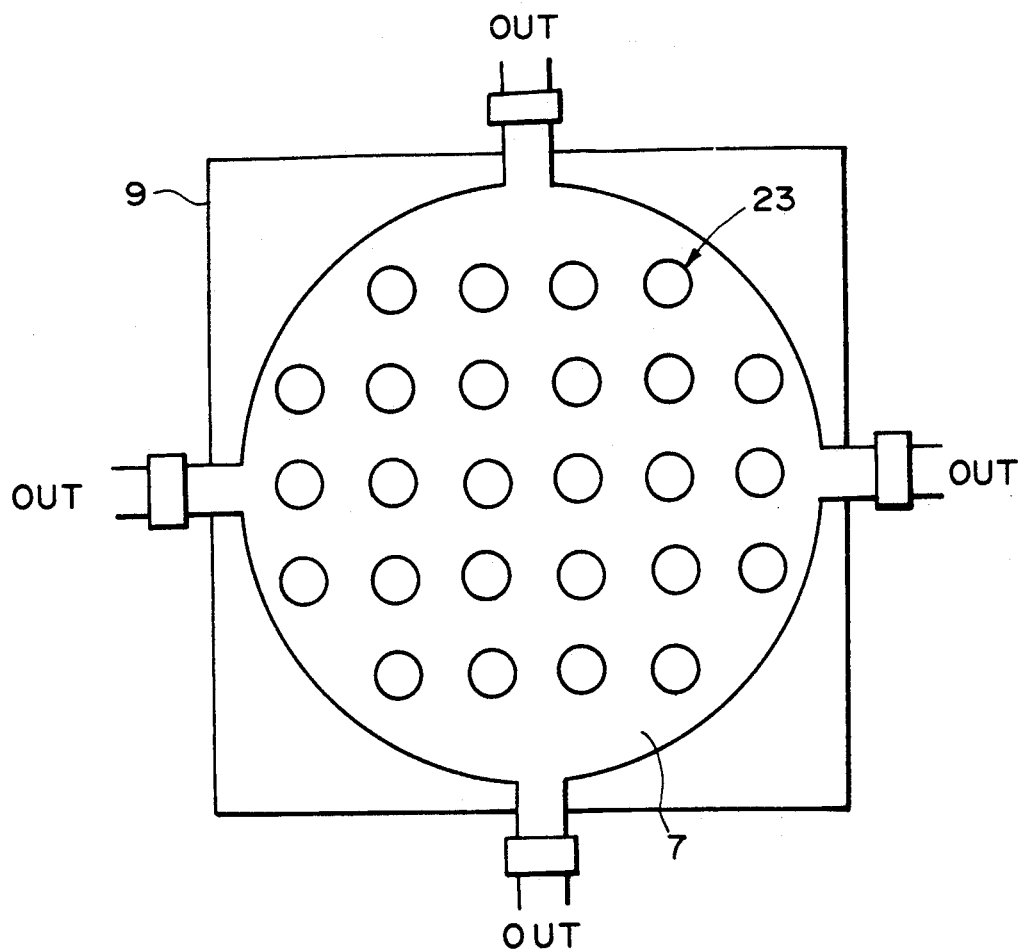
FIG. 2C is a section taken on a line C—C in FIG. 2B.

Of these Figures, FIG. 2A is a top plan view, FIG. 2B is a schematic view partly in section taken along a line B—B in FIG. 2A, and FIG. 2C is a section taken along a line C—C in FIG. 2B. As best seen in FIG. 2B, the attracting table 7 includes a base member 21 which is made of an organic material or ceramics, a pair of embedded electrodes 22, a plurality of passageways 23, each for allowing flow of a temperature adjusted water or gas, and an electrically insulative layer 24. The temperature adjusting means 6 (FIG. 1) comprises a plurality of temperature controls 6a each for controlling the flow rate and the temperature of the fluid flowing through a corresponding passageway 23, and a fluid supply source 6b for supplying a fluid into each of the passageways 23. Denoted at 28 is a heat insulating material and, at 29, a plurality of temperature sensors. The fluid supply source 6b may be of the type that can supply a temperature controlled fluid and thus, each control 6a may be one that simply controls the flow rate of the fluid.

In this embodiment, as seen from FIG. 2B, a wafer is attracted to the wafer chucking table by an electrostatically attracting force. However, use of such an electrostatic chuck is not indispensable, and a vacuum attraction process, a magnetically attracting process or otherwise may be used.

In this embodiment, the sensors 29 may be provided in the base member of the chucking table at those positions which respectively correspond to the sites which should be brought to the exposure position in sequence during the step-and-repeat exposures of a wafer. Of course, the positions of the sensors 29 may be determined, while taking into account the possibility of changing the pitch of stepwise movement (stepwise feeding). Preferably, the passageways 23 are provided in a one-to-one relationship with the temperature sensors 29, as best seen in FIG. 2B. More specifically, these passageways 23 have fluid discharging ports which are in a one-to-one relationship with the sensors 29. On the other hand, the chucking table is formed with four outlet ports through which the fluid can be exhausted. However, one outlet port may be provided in association with one fluid discharging port of one passageway. Also, one outlet port may be provided for two fluid discharging ports of two passageways.

Figure 3A:
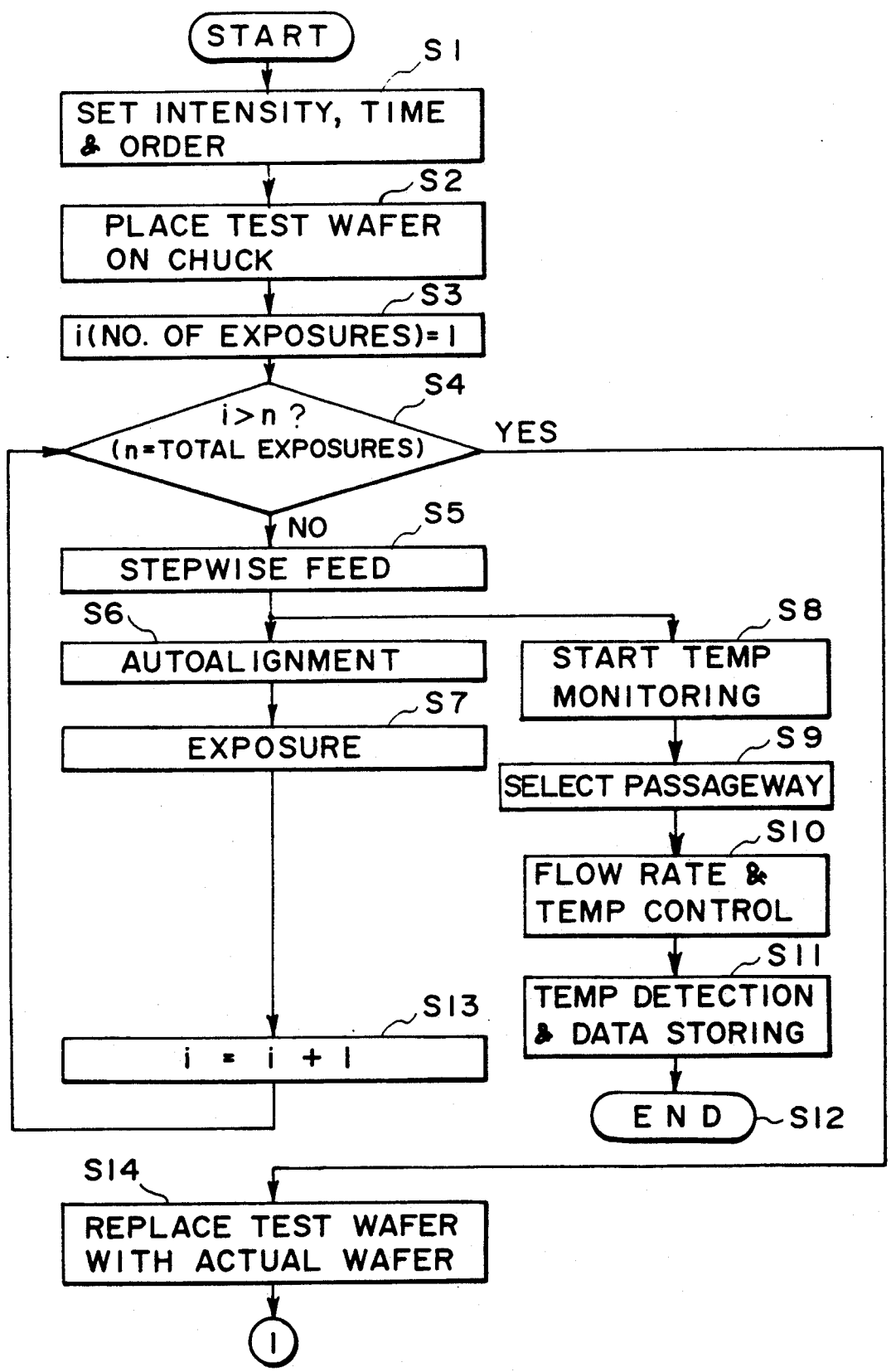

In this embodiment, the temperature control is made by flowing a fluid through a selected passageway, which fluid is, supplied from the fluid supply source 6b, with the temperature and the flow rate of the flowing fluid being controlled by a corresponding adjusting device 6a under the control of the CPU 8. Details of the temperature control will now be explained, particularly with reference to FIGS. 3A and 3B.

First, in the alignment and exposure sequence, a desired radiation energy (intensity of irradiation) and a desired irradiation time (exposure time) for each step position on a wafer (the site of each portion of the wafer to be placed at the exposure position), as well as the order of exposures of these step positions on the wafer, are set (step S1). Also, a desired temperature of the wafer to be maintained is set. Subsequently, as a sample, a test wafer is placed on the chucking table and, then, an electric voltage is applied to the electrodes 22. As a result, the test wafer is electrostatically attracted to and held by the insulative layer 24 (step S2). After this, the test wafer is subjected to step-and-repeat exposures in accordance with the predetermined order (steps S3–S7 and S13). Along the execution of the exposures, any local temperature change at each step position on the test wafer is detected by a corresponding temperature sensor 9 (step S8). Simultaneously with the detection of temperature change, the selection of an appropriate passageway or passageways (if desired) and the control of the flow rate and temperature of the fluid to be passed through the selected passageway, are made so as to correct the detected temperature change to thereby retain the desired wafer temperature (steps S9 and S10). Data concerning the detected temperature changes, as well as those data concerning the selection of passageways and the controlled flow rate and temperature of the fluid, with respect to every step position on the wafer, is stored into a suitable memory (not shown) of the CPU 8 (step S11).

Figures 4A, 4B:
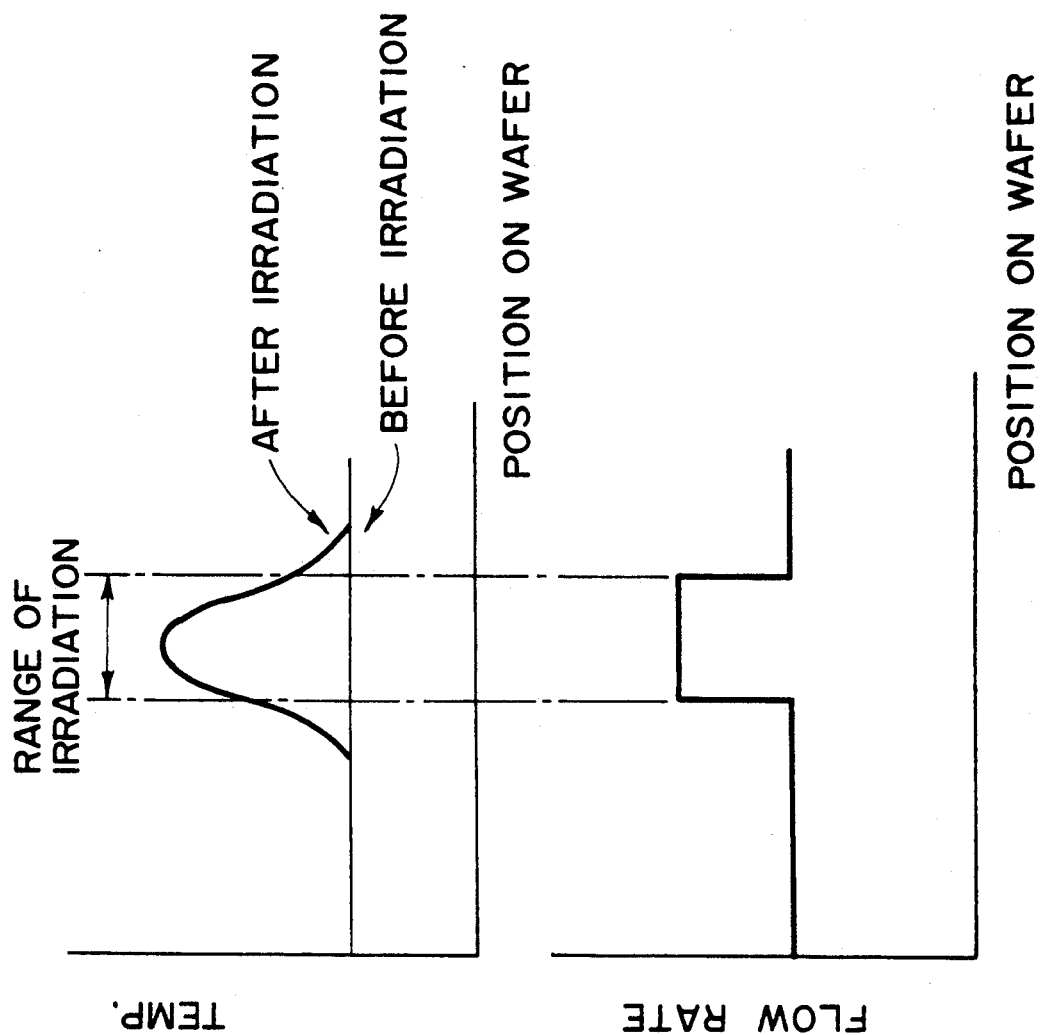
FIGS. 4A and 4B are representations for explaining the temperature control made in the embodiment of FIG. 1.

Those data are used during an actual photoprinting process to control the temperature and the flow rate of a fluid flowing through a selected passageway 23 or passageways (if desired), under the influence of the CPU 8 and with the cooperation of a corresponding adjusting device 6a, to thereby execute concentrated temperature control (controlled cooling) of each step position of a wafer and a portion thereof adjacent to that step position. By this, the entire wafer can be maintained substantially at the set temperature and, therefore, any local distortion of the wafer can be prevented. In this embodiment, the temperature control (controlled cooling) is made by controlling the flow rate in the manner such as depicted in FIG. 4B, to a temperature change such as depicted in FIG. 4A, wherein FIG. 4A exemplifies a temperature change at the time of exposure of a certain step position on a wafer, while FIG. 4B depicts a necessary flow rate control for the correction of the temperature change in FIG. 4A. The necessary flow rate is determined in the CPU 8, while taking into account the throughput of the apparatus. Of course, the temperature control may be made in a real-time control fashion. With such a feedback control, however, there is a possibility of time lag. Further, the temperature of the fluid flowing through a passageway is set and controlled at the desired wafer temperature to be maintained, which temperature is set prior to the temperature detection.

After the collection of the temperature control data by using a test wafer is completed, the test wafer is replaced by a wafer which is to be actually processed (step S14), and step-and-repeat exposures are effected (steps S15–S19 and S23). Then, as the step positions of the wafer are brought to the exposure position in sequence during the step-and-repeat exposure process, the flow rate of fluid flowing through a corresponding passageway 23 is controlled in accordance with the local temperature change at a corresponding step position, the control being made in a timed relationship with the irradiation time based on the exposure sequence, under the control of the CPU 8 in which the data have been stored. By this, any local temperature increase at each step position of the wafer due to the irradiation with the exposure energy can be corrected. Thus, by controlling the temperature of the chucking table locally, the temperature of each portion of the wafer can be controlled concentratingly (steps S20–S22). In this embodiment, the temperature control is made by using fluid flowing through a passageway positioned beneath a step position when the same is at the exposure position and, if desired, fluid flowing through one or more passageways adjacent thereto.

The CPU 8 is operable, as the portions of the wafer are exposed in the step-and-repeat manner, to start the temperature control to each step position before the temperature thereat increases due to irradiation with the radiation energy and, thus, the CPU 8 controls the flow rate of the fluid to assure this. After exposure at a step position is completed, the temperature control thereto is finished, and the temperature control to a next step position is made in a similar manner. Since, however, the next step position is predetermined in accordance with the predetermined exposure sequence, the temperature control to the next step position may be made before the completion of the exposure at the current step position. In that case, it is possible to prevent accumulation of heat at the next step position which easily causes local distortion of the wafer and, thus, an alignment error at the next step position. Therefore, by doing so, the alignment operation at the next step position can be initiated just after the stepwise movement to be made after the completion of the exposure at the current step position.

Figure 5:
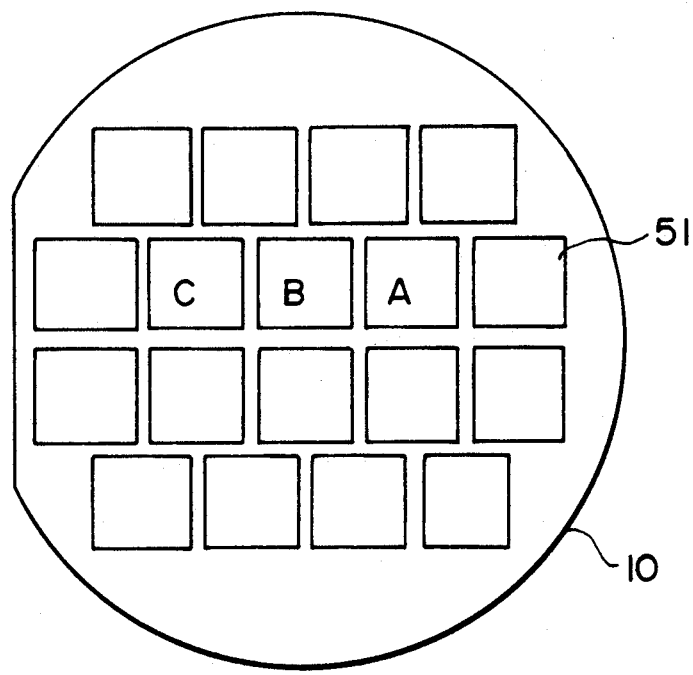
FIG. 5 is a plan view of a wafer, for explaining a second embodiment of the present invention.

FIG. 5 shows a second embodiment wherein the manner of temperature detection is different. In FIG. 5, reference numeral 10 denotes a wafer and reference numeral 51 denotes each step position (shot area). While in the foregoing embodiment, the temperature measurement is made at each step position, in this embodiment, the temperature measurement is made at selected ones of the plurality of step positions. More specifically, only with regard to desired ones of the step positions, the temperature change of the wafer portions at the selected step positions and portions in the neighborhood thereof is measured. In FIG. 5, for example, only a shot area A may be selected at the measurement step position, and the measurement may be made to the temperature change in the shot area A as it is irradiated with the radiation energy and, at the same time, the measurement may be made to the shot areas B and C adjacent thereto. By using data obtained therefrom, the amount of temperature control at every shot position of the wafer is determined. This can be made in a case when the exposure time and the exposure intensity are substantially constant with regard to the different shot positions.

As described, the temperature measurement is made in this embodiment not only to a certain selected step position (shot area), but also to one or more (two in this embodiment) step positions in the neighborhood thereof. This is done to also allow temperature control to those step positions so as to remove any heat propagated thereto from the current step position, the control being made before each of those second and third step positions is brought to the exposure station. Namely, the temperature control to those neighboring step positions is made at the same time as the temperature control to the current step position.

In other words, in the present embodiment, by using that data obtained by the temperature measurement made to a plurality of neighboring step positions, including a current step position, the magnitude of temperature control to be made to the current step position as well as the next step position and the one following that step, is determined. The control is then made in accordance with the determined data. This allows good temperature control in a stepper.

Figure 6:
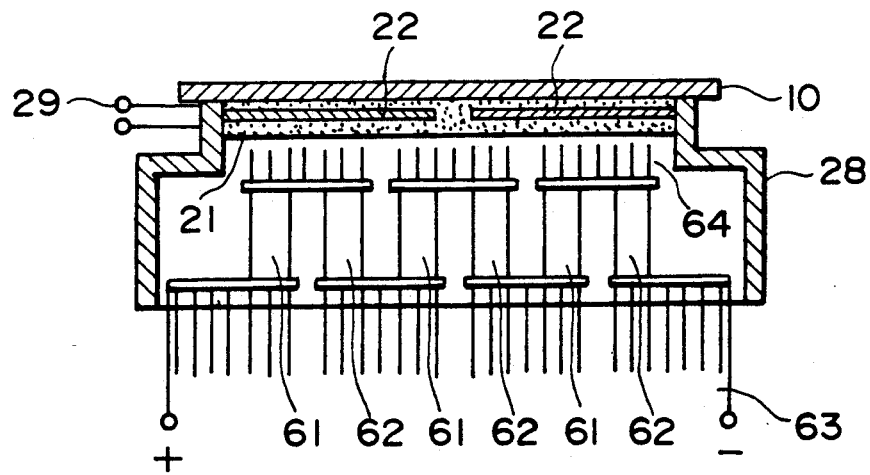
FIG. 6 is a sectional view showing the structure of a third embodiment of the present invention.

FIG. 6 shows a third embodiment of the present invention. Like reference numerals, as those of the foregoing embodiments, are assigned to similar or corresponding elements.

In FIG. 6, denoted at 61 are N-type elements; at 62, P-type elements; at 63, a radiating fin; at 64, a heat absorbing fin. The elements 61 and 62 are formed by an intermetallic compound such as, for example, $Bi_2Te_3$ and provide electronic cooling members of a type in which the temperature at a junction decreases in response to the application of an electric current, due to the Peltier effect. Like the foregoing embodiments, the heat absorbing fin 62 has elements which are disposed to allow concentrated temperature control at each step position on a wafer during the step-and-repeat exposures thereof.

When, in operation, electric currents are supplied from an unshown electric power source to the P-type and N-type electronic cooling members 61 and 62, the bottom surface of the chuck base member 21 is cooled due to the Peltier effect. Of course, the supply of electric current is controlled in response to the instruction signals from a CPU, so that the temperature at each step position on the wafer is controlled and maintained at a desired wafer temperature to be retained. By this, substantially the same effects are obtainable.

While the invention has been described with reference to the structures disclosed herein, it is not confined to the details set forth and this application is intended to cover such modifications or changes as may come within the purposes of the improvements or the scope of the following claims.

What is claimed is:

1. A method of exposure control for use in a step-and-repeat type exposure apparatus that includes a radiation source for emitting a radiation beam and a workpiece holding chuck having an attracting surface, said method comprising the steps of:

placing a first workpiece on the attracting surface of the workpiece holding chuck so that the first workpiece is attracted to and held by the workpiece holding chuck;

moving the workpiece holding chuck stepwise so that different portions of the first workpiece are sequentially brought to an exposure position, and exposing that portion of the first workpiece placed at the exposure position to a radiation beam emitted from the radiation source;

detecting the temperature of the attracting surface of the workpiece holding chuck each time a portion of the first workpiece is exposed at the exposure position;

memorizing data related to the detected temperature;

removing the first workpiece from the workpiece holding chuck and placing a second workpiece on the attracting surface of the workpiece holding chuck;

moving the workpiece holding chuck, bearing the second workpiece, stepwise so that different portions of the second workpiece are sequentially brought to the exposure position for exposure to the radiation beam emitted from the radiation source; and adjusting the temperature of the attracting surface of the workpiece holding chuck each time a portion of the second workpiece is brought to the exposure position, in accordance with the memorized data.

2. A method according to claim 1, wherein said temperature adjusting step comprises concentratingly controlling the temperature of such a zone of the attracting surface of the workpiece holding chuck that corresponds to and is adjacent to that portion of the second workpiece placed at the exposure position, in accordance with movement of the workpiece holding chuck bearing the second workpiece.

* * * * *